United States Patent
Minagawa

(10) Patent No.: US 12,046,993 B2
(45) Date of Patent: Jul. 23, 2024

(54) SEMICONDUCTOR DEVICE

(71) Applicant: FUJI ELECTRIC CO., LTD., Kawasaki (JP)

(72) Inventor: Kei Minagawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 30 days.

(21) Appl. No.: 18/089,802

(22) Filed: Dec. 28, 2022

(65) Prior Publication Data

US 2023/0275506 A1 Aug. 31, 2023

(30) Foreign Application Priority Data

Feb. 28, 2022 (JP) ................. 2022-029984

(51) Int. Cl.
*H02M 1/32* (2007.01)
*H03K 17/082* (2006.01)
*H03K 17/08* (2006.01)

(52) U.S. Cl.
CPC ........ *H02M 1/327* (2021.05); *H03K 17/0822* (2013.01); *H03K 17/0828* (2013.01); *H03K 2017/0806* (2013.01)

(58) Field of Classification Search
CPC .................................................. H02M 1/327
USPC ......................................................... 327/512
See application file for complete search history.

(56) References Cited

U.S. PATENT DOCUMENTS

2017/0077919 A1    3/2017  Nakamori
2018/0367023 A1*  12/2018  Terashima .............. H02M 1/08

FOREIGN PATENT DOCUMENTS

WO        2016/103929 A1    6/2016
WO        2018/042939 A1    3/2018

* cited by examiner

*Primary Examiner* — Tomi Skibinski
(74) *Attorney, Agent, or Firm* — Rabin & Berdo, P.C.

(57) ABSTRACT

A semiconductor device having a load. The semiconductor device including: an output element configure to connect to the load, the output element being switchable to operate the load; a drive circuit which outputs a drive signal for driving the output element to switch; a detection circuit which compares a state signal, indicative of an operating state of the output element, with a detection threshold, to thereby detect an abnormal level of the operating state; an abnormal level notification circuit which informs an outside of the detected abnormal level; an external terminal configured to receive an external signal for adjusting the detection threshold; and a detection threshold adjustment circuit which adjusts the detection threshold on a basis of the received external signal.

10 Claims, 11 Drawing Sheets

SEMICONDUCTOR DEVICE

CROSS-REFERENCE TO RELATED APPLICATION

This application is based upon and claims the benefit of priority of the prior Japanese Patent Application No. 2022-029984, filed on Feb. 28, 2022, the entire contents of which are incorporated herein by reference.

BACKGROUND OF THE INVENTION

1. Field of the Invention

The embodiment discussed herein relates to a semiconductor device having a power semiconductor element protection function.

2. Background of the Related Art

In recent years, the development of semiconductor devices referred to as intelligent power modules (IPMs) has progressed. Such an IPM incorporates a power semiconductor element, such as an insulated gate bipolar transistor (IGBT), a drive circuit which drives the power semiconductor element, and the like.

IPMs are widely used in automotive electrical systems such as transmissions, engines, and brakes. Products which comply miniaturization, high performance, and high reliability are demanded.

Furthermore, such an IPM has the function of monitoring a current flowing through a power semiconductor element, the temperature of a chip in the power semiconductor element, or the like and protecting the power semiconductor element against a break on the basis of a monitoring result.

FIG. 11 is a view for describing the protection function of a conventional IPM. FIG. 11 illustrates as an example of the protection function of an IPM an overheat protection function including an output section 110 including an IGBT 111 and a temperature sensor 112 and a temperature detection comparator 101.

The temperature sensor 112 is located near the IGBT 111 and measures the temperature of the IGBT 111 at drive time. The temperature detection comparator 101 compares a voltage level of a signal indicative of a temperature measuring result outputted from the temperature sensor 112 with a voltage level of a detection threshold Vf. Furthermore, if the temperature detection comparator 101 recognizes on the basis of a comparison result that the temperature of the IGBT 111 is in an overheat state, then the temperature detection comparator 101 outputs an abnormal level signal.

A technique for outputting, in the case of a detected temperature reaching a threshold temperature, a notice alarm signal before performing overheat protection was proposed as a related art (see, for example, International Publication Pamphlet No. WO 2016/103929). Furthermore, a technique for selectively outputting from an alarm terminal of a drive unit a signal for identifying an abnormal factor and a signal indicative of the continuation of the occurrence of the abnormal factor was proposed as a related art (see, for example, International Publication Pamphlet No. WO 2018/042939).

With the above protection function of an IPM, a detection level at the time of an abnormal level signal being outputted is determined by the detection threshold Vf of the temperature detection comparator 101. Traditionally, the detection threshold Vf has been determined in the manufacturing process and has been fixed. In the above description, overheat protection is discussed. Traditionally, however, a detection threshold for overcurrent protection, protection against a control voltage decrease in a device, or the like has been a fixed value. This is the same as the detection threshold Vf for overheat protection.

Traditionally, as stated above, a detection threshold in a protection function has been fixed in the manufacturing process. As a result, it is difficult to flexibly change it to desired values according to customers or uses.

SUMMARY OF THE INVENTION

According to an aspect, there is provided a semiconductor device having a load, including: an output element configured to be connected to the load, the output element being switchable to operate the load; a drive circuit which outputs a drive signal for driving the output element to switch; a detection circuit which compares a state signal, indicative of an operating state of the output element, with a detection threshold, to thereby detect an abnormal level of the operating state; an abnormal level notification circuit which informs an outside of the detected abnormal level; an external terminal configured to receive an external signal for adjusting the detection threshold; and a detection threshold adjustment circuit which adjusts the detection threshold on a basis of the received external signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described with reference to the accompanying drawings.

Figure 1:
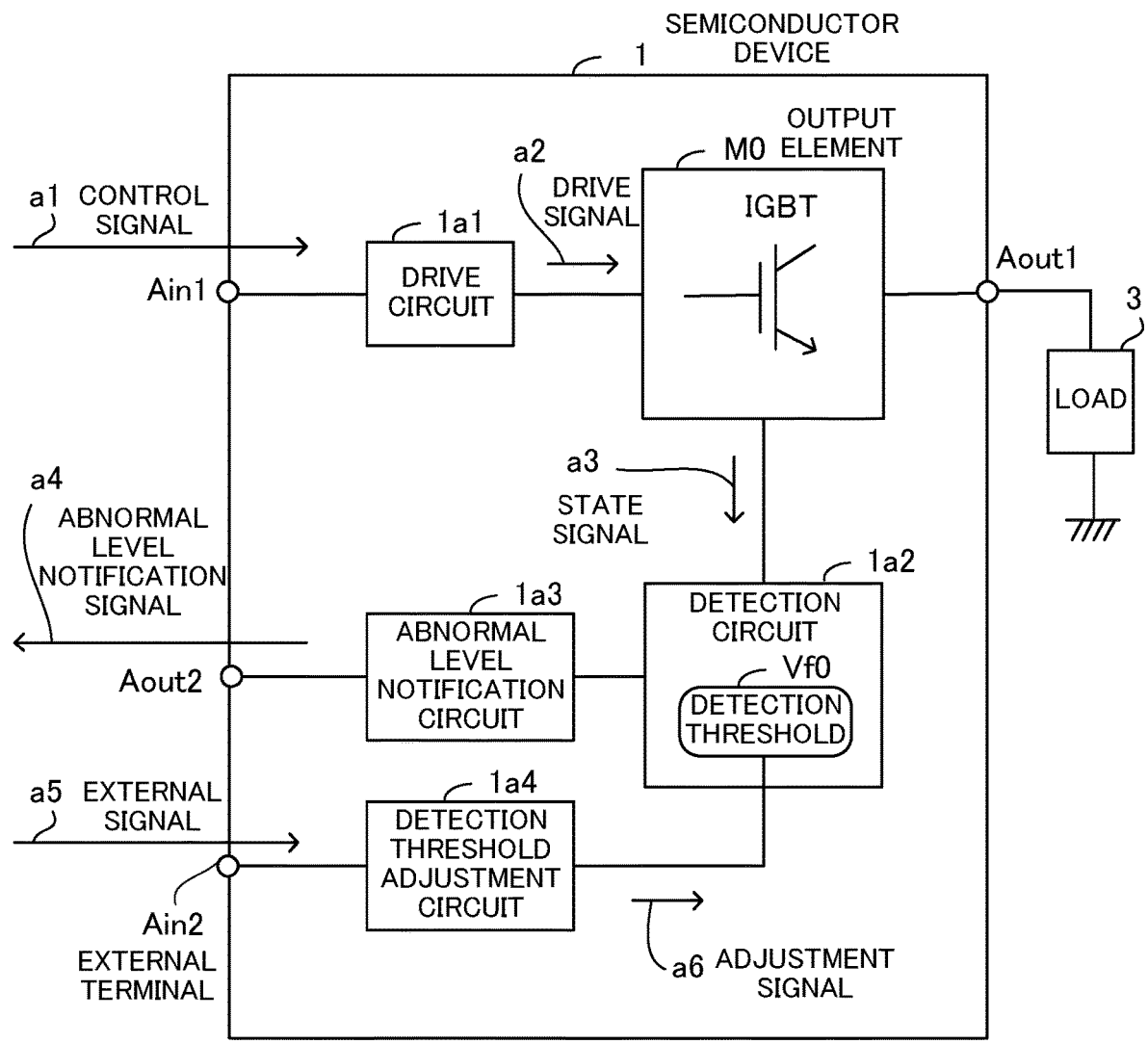
FIG. 1 is a view for describing an example of a semiconductor device.

FIG. 1 is a view for describing an example of a semiconductor device. A semiconductor device 1 includes an output element M0, a drive circuit 1a1, a detection circuit 1a2, an abnormal level notification circuit 1a3, and a detection threshold adjustment circuit 1a4. Furthermore, the semiconductor device 1 includes an input terminal Ain1, an external terminal Ain2, and output terminals Aout1 and Aout2.

The output element M0 is a voltage-controlled semiconductor element such as an IGBT or a metal-oxide-semiconductor field-effect transistor (MOSFET). The output element M0 is connected via the output terminal Aout1 to the load 3 and operates the load 3 by switching. For example, the load 3 is an inductive load, such as a solenoid valve, widely used in an automobile or the like.

The drive circuit 1a1 receives via the input terminal Ain1 a control signal a1 transmitted from a microcomputer or the like. The drive circuit 1a1 generates on the basis of the control signal a1 a drive signal a2 for turning on or off the output element M0, and outputs the drive signal a2 to the output element M0 to perform switching of the output element M0.

The detection circuit 1a2 compares a state signal a3 indicative of an operating state with a detection threshold Vf0 and detects an abnormal level of the operating state of the output element M0 on the basis of a comparison result. The state signal a3 includes at least one of the temperature of the output element M0, a current flowing through the output element M0, and a control voltage in the semiconductor device 1.

The operating state of the output element M0 to be protected is the temperature state, the current state, or the like of the output element M0. In this case, the detection circuit 1a2 compares the state signal a3 indicative of the operating state, which is the temperature state or the current state, with the detection threshold Vf0 and detects whether the output element M0 is in an overheat or overcurrent state corresponding to an abnormal level.

If the detection circuit 1a2 detects an abnormal level, then the abnormal level notification circuit 1a3 outputs an abnormal level notification signal a4 via the output terminal Aout2 to notify the outside of the occurrence of an overheat state or an overcurrent state.

On the other hand, the semiconductor device 1 includes the external terminal Ain2 as a new terminal. An external signal a5 is inputted via the external terminal Ain2. The external signal a5 is used for adjusting a voltage level of the detection threshold Vf0 used by the detection circuit 1a2, and is inputted from a user-side maintenance unit or the like via the external terminal Ain2. The detection threshold adjustment circuit 1a4 generates an adjustment signal a6 on the basis of the external signal a5 inputted, and adjusts the detection threshold Vf0 and sets the detection threshold Vf0 to a determined value by the adjustment signal a6.

As has been described, with the semiconductor device 1, the detection threshold adjustment circuit 1a4 adjusts, on the basis of the external signal a5 inputted via the external terminal Ain2, the detection threshold Vf0 used by the detection circuit 1a2 for detecting an abnormal level of the operating state of the output element M0. By doing so, the detection threshold Vf0 used in a protection function is changed flexibly and easily to desired values according to customers or uses.

Figure 2:
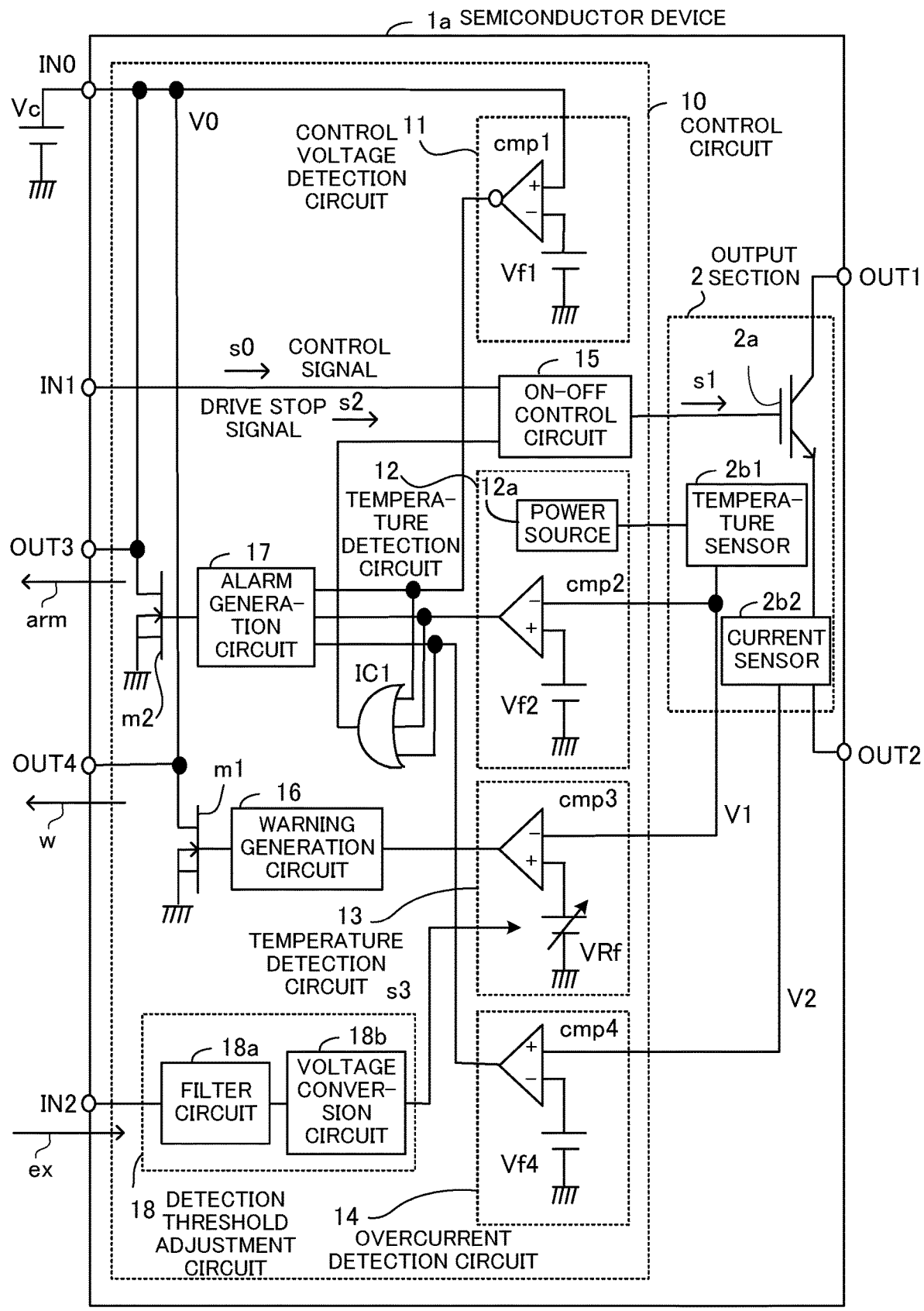
FIG. 2 illustrates an example of the structure of a semiconductor device.

The structure and operation of the semiconductor device 1 will now be described in further detail. FIG. 2 illustrates an example of the structure of a semiconductor device. For example, a semiconductor device 1a is applied to an IPM. The semiconductor device 1a includes input terminals IN0 and IN1, an external terminal IN2, and output terminals OUT1, . . . , and OUT4 as input and output terminals and includes a control circuit 10 and an output section 2.

The output section 2 includes an IGBT 2a, a temperature sensor 2b1, and a current sensor 2b2. The control circuit 10 includes a control voltage detection circuit 11, temperature detection circuits 12 and 13, an overcurrent detection circuit 14, an on-off control circuit 15, a warning generation circuit 16, an alarm generation circuit 17, and a detection threshold adjustment circuit 18. Furthermore, the control circuit 10 includes a logical OR element IC1 with three inputs and one output and NMOS transistors m1 and m2 each of which is an n-channel MOSFET.

The control voltage detection circuit 11, the temperature detection circuits 12 and 13, and the overcurrent detection circuit 14 realize the function of the detection circuit 1a2 of FIG. 1. Furthermore, the warning generation circuit 16 and the alarm generation circuit 17 realize the function of the abnormal level notification circuit 1a3 of FIG. 1.

The control voltage detection circuit 11 includes a comparator cmp1 and a reference power source which outputs a reference voltage Vf1. The temperature detection circuit 12 includes a power source 12a, a comparator cmp2, and a reference power source which outputs a reference voltage Vf2.

The temperature detection circuit 13 includes a comparator cmp3 and a reference variable power source which outputs a reference variable voltage VRf. The overcurrent detection circuit 14 includes a comparator cmp4 and a reference power source which outputs a reference voltage Vf4.

In the output section 2, a collector of the IGBT 2a is connected to the output terminal OUT1 and an emitter of the IGBT 2a is connected to the output terminal OUT2. If the IGBT 2a is located on the high side (if the semiconductor device 1a is used as a high-side IPM), then a positive electrode side (P side) of a power supply is connected to the output terminal OUT1 and a load is connected to the output terminal OUT2.

Furthermore, if the IGBT 2a is located on the low side (if the semiconductor device 1a is used as a low-side IPM), then the load is connected to the output terminal OUT1 and a negative electrode side (N side) of the power supply is connected to the output terminal OUT2.

The temperature sensor 2b1 receives a voltage supplied from the power source 12a included in the temperature detection circuit 12, measures the driving temperature of the IGBT 2a, and outputs a voltage signal V1 corresponding to a measurement result. The power source 12a divides a control voltage V0 inputted from the input terminal IN0 and supplies to the temperature sensor 2b1 a voltage obtained by the division.

The temperature sensor 2b1 outputs the voltage signal V1 (first voltage signal) which is such that a voltage level decreases with an increase in the driving temperature of the IGBT 2a. A temperature detection diode may be used as the temperature sensor 2b1.

The current sensor 2b2 measures a current flowing through the emitter of the IGBT 2a and outputs a voltage signal V2 (second voltage signal) corresponding to a measurement result. The current sensor 2b2 outputs the voltage signal V2 which is such that a voltage level increases with an increase in the current flowing through the emitter of the IGBT 2a.

On the other hand, a control voltage power source Vc is connected to the input terminal IN0 and the control voltage V0 supplied from the control voltage power source Vc is used as a power source voltage of the control circuit 10. The control voltage V0 is inputted to a non-inverting input terminal (+) of the comparator cmp1 included in the control voltage detection circuit 11 and the reference voltage Vf1 (first detection threshold) is inputted to an inverting input terminal (−) of the comparator cmp1.

When a level of the control voltage V0 falls below the reference voltage Vf1, the comparator cmp1 outputs an H level (negative logic output). An H level outputted from the comparator cmp1 indicates a control voltage decrease state, that is to say, an abnormal level.

Furthermore, a microcomputer (not illustrated) is connected to the input terminal IN1 and a pulsed control signal s0 outputted from the microcomputer is inputted to one input end of the on-off control circuit 15. The on-off control circuit 15 generates, on the basis of the control signal s0, a drive signal s1 for driving the IGBT 2a and outputs the drive signal s1 to a gate of the IGBT 2a.

The reference variable voltage VRf (second detection threshold) is inputted to a non-inverting input terminal (+) of the comparator cmp3 included in the temperature detection circuit 13 (first temperature detection circuit) and the voltage signal V1 indicative of the temperature state of the IGBT 2a is inputted to an inverting input terminal (−) of the comparator cmp3.

When a level of the voltage signal V1 falls below the reference variable voltage VRf, the comparator cmp3 outputs an H level (first overheat state abnormal level) to the warning generation circuit 16. If the comparator cmp3 outputs an H level, then the driving temperature of the IGBT 2a is in an overheat warning state (first overheat state).

When the warning generation circuit 16 receives the H-level signal outputted from the comparator cmp3, the warning generation circuit 16 generates an H-level warning signal and outputs it to a gate of the NMOS transistor m1.

The control voltage V0 is applied to a drain of the NMOS transistor m1 and a source of the NMOS transistor m1 is connected to GND. Accordingly, when the H-level warning signal is inputted to the gate of the NMOS transistor m1, the NMOS transistor m1 is turned on.

When the NMOS transistor m1 is turned on, a warning notification signal (notice alarm signal) w is outputted from the output terminal OUT4 connected to the drain of the NMOS transistor m1. For example, the warning notification signal w is received by the microcomputer and a user is informed of the warning notification signal w.

The reference voltage Vf2 (third detection threshold) is inputted to a non-inverting input terminal (+) of the comparator cmp2 included in the temperature detection circuit 12 (second temperature detection circuit) and the voltage signal V1 indicative of the temperature state of the IGBT 2a is inputted to an inverting input terminal (−) of the comparator cmp2.

When a level of the voltage signal V1 falls below the reference voltage Vf2, the comparator cmp2 outputs an H level (second overheat state abnormal level) to the alarm generation circuit 17. If the comparator cmp2 outputs an H level, then the driving temperature of the IGBT 2a is in an overheat alarm state (second overheat state).

A level of the reference voltage Vf2 set is lower than a level of the reference variable voltage VRf. Accordingly, if a level of the voltage signal V1 falls below a warning level of the reference variable voltage VRf and falls further below the reference voltage Vf2, then the comparator cmp2 outputs an H level. That is to say, if the driving temperature of the IGBT 2a rises above the overheat warning state and reaches the overheat alarm state, then the comparator cmp2 outputs an H level.

The voltage signal V2 indicative of the current state of the IGBT 2a is inputted to a non-inverting input terminal (+) of the comparator cmp4 included in the overcurrent detection circuit 14 and the reference voltage Vf4 (fourth detection threshold) is inputted to an inverting input terminal (−) of the comparator cmp4. When a level of the voltage signal V2 exceeds the reference voltage Vf4, the comparator cmp4 outputs an H level (overcurrent abnormal level) to the alarm generation circuit 17. If the comparator cmp4 outputs an H level, then the IGBT 2a is in an overcurrent state.

A signal outputted from the comparator cmp1 included in the control voltage detection circuit 11, a signal outputted from the comparator cmp2 included in the temperature detection circuit 12, and a signal outputted from the comparator cmp4 included in the overcurrent detection circuit 14 are inputted to the alarm generation circuit 17. If at least one abnormal state of a control voltage decrease state, an overheat alarm state, and an overcurrent state arises, then the alarm generation circuit 17 generates and outputs an H-level alarm signal.

In this case, when the alarm generation circuit 17 receives an H-level signal outputted from at least one of the comparators cmp1, cmp2, and cmp4, the alarm generation circuit 17 generates an H-level alarm signal and outputs it to a gate of the NMOS transistor m2.

The control voltage V0 is applied to a drain of the NMOS transistor m2 and a source of the NMOS transistor m2 is connected to the GND. Accordingly, when the H-level alarm signal is inputted to the gate of the NMOS transistor m2, the NMOS transistor m2 is turned on.

When the NMOS transistor m2 is turned on, an alarm notification signal (alarm signal) arm is outputted from the output terminal OUT3 connected to the drain of the NMOS transistor m2. The alarm level of the alarm notification signal arm is higher than that of the warning notification signal w. For example, the alarm notification signal arm is received by the microcomputer and the user is informed of the alarm notification signal arm.

Alarm notification signals arm generated by the alarm generation circuit 17 differ in pulse width according to factors, that is to say, according to a control voltage decrease state, an overheat alarm state, and an overcurrent state. For example, with overcurrent protection, the typical value of a first pulse width of an alarm notification signal arm (first alarm signal) is 2 ms. With control voltage decrease protection, the typical value of a second pulse width of an alarm notification signal arm (second alarm signal) is 4 ms. With overheat protection, the typical value of a third pulse width of an alarm notification signal arm (third alarm signal) is 8 ms.

Alarm notification signals arm having different pulse widths are outputted in this way according to factors, that is to say, according to a control voltage decrease state, an overheat alarm state, and an overcurrent state. Accordingly, the user easily perceives which abnormal state is indicated by an alarm notification signal arm outputted.

On the other hand, a signal outputted from the comparator cmp1 included in the control voltage detection circuit 11, a signal outputted from the comparator cmp2 included in the temperature detection circuit 12, and a signal outputted from the comparator cmp4 included in the overcurrent detection circuit 14 are inputted to three input ends, respectively, of the logical OR element IC1.

As a result, if at least one abnormal state of a control voltage decrease state, an overheat alarm state, and an overcurrent state arises, then the logical OR element IC1 outputs an H-level drive stop signal s2. An output end of the logical OR element IC1 is connected to the other input end of the on-off control circuit 15.

Accordingly, when the on-off control circuit 15 receives the H-level drive stop signal s2 outputted from the logical OR element IC1, the on-off control circuit 15 outputs an L-level drive signal s1 to the gate of the IGBT 2a, turns off the IGBT 2a, and stops driving of the IGBT 2a.

On the other hand, an external signal ex is inputted to the external terminal IN2. The external signal ex is used for adjusting the reference variable voltage VRf used in the temperature detection circuit 13. For example, the external signal ex at a determined voltage level may be inputted from the user side.

The detection threshold adjustment circuit 18 generates an adjustment signal s3 on the basis of the external signal ex inputted, and adjusts the reference variable voltage VRf, which is a detection threshold, and sets the reference variable voltage VRf to a determined value by the adjustment signal s3.

Furthermore, the detection threshold adjustment circuit 18 includes a filter circuit 18a and a voltage conversion circuit 18b. The filter circuit 18a performs filtering, that is to say, removes a noise component from the external signal ex and smoothes it. The voltage conversion circuit 18b converts a voltage level of a signal obtained by filtering by the filter circuit 18a to a determined voltage level of the reference variable voltage VRf.

A voltage inputted to the comparator cmp3 is, for example, 1.5 V or less and has a small value. If the external signal ex having a small voltage value is inputted from the outside, it is apt to be affected by disturbance and its voltage level is apt to fluctuate.

Accordingly, the external signal ex having a value larger than the reference variable voltage VRf is inputted from the external terminal IN2 and its voltage level is decreased by the voltage conversion circuit 18b to a determined reference variable voltage VRf. By doing so, the adjustment signal s3 is generated. As a result, the reference variable voltage VRf of the comparator cmp3 is adjusted with accuracy by the external signal ex which is less likely to be affected by disturbance.

In the above description, the reference variable voltage VRf of the comparator cmp3 included in the temperature detection circuit 13 is considered as a detection threshold and is adjusted by the detection threshold adjustment circuit 18 on the basis of the external signal ex. However, a reference voltage of a comparator included in another detection circuit may be adjusted.

That is to say, the reference voltage Vf1 of the comparator cmp1 included in the control voltage detection circuit 11, the reference voltage Vf2 of the comparator cmp2 included in the temperature detection circuit 12, or the reference voltage Vf4 of the comparator cmp4 included in the overcurrent detection circuit 14 may be adjusted by the detection threshold adjustment circuit 18 on the basis of the external signal ex.

Furthermore, in the above description, a reference voltage of a comparator included in a detection circuit is adjusted by the detection threshold adjustment circuit 18 on the basis of the external signal ex. However, reference voltages of comparators included in a plurality of detection circuits may be adjusted by the detection threshold adjustment circuit 18 on the basis of the external signal ex.

For example, the reference variable voltage VRf of the comparator cmp3 included in the temperature detection circuit 13 and the reference voltage Vf4 of the comparator cmp4 included in the overcurrent detection circuit 14 may be adjusted by the detection threshold adjustment circuit 18 on the basis of the external signal ex.

In this case, however, the external signal ex used for adjusting the reference variable voltage VRf and an external signal ex used for adjusting the reference voltage Vf4 are needed. Accordingly, it is desirable to locate two external terminals and two detection threshold adjustment circuits 18. That is to say, one of the two detection threshold adjustment circuits 18 is used for adjusting the reference variable voltage VRf and the other is used for adjusting the reference voltage Vf4.

Figure 3:
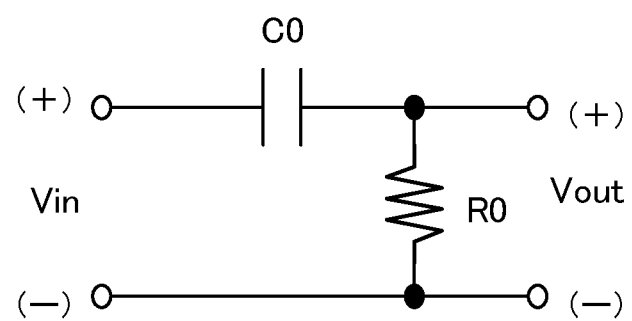
FIG. 3 illustrates an example of the structure of a filter circuit.

FIG. 3 illustrates an example of the structure of a filter circuit. A filter circuit 18a1 includes a capacitor C0 and a resistor R0 and is a high-pass filter. One end of the capacitor C0 is connected to a positive side input terminal of an input voltage Vin and the other end of the capacitor C0 is connected to one end of the resistor R0 and a positive side output terminal of an output voltage Vout.

The other end of the resistor R0 is connected to a negative side input terminal of the input voltage Vin and a negative side output terminal of the output voltage Vout. The filter circuit 18a1, which is a high-pass filter, removes a low-frequency noise component from the external signal ex.

Figure 4:
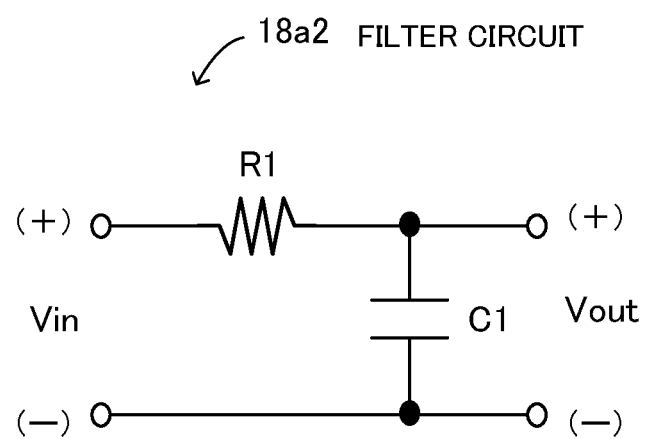
FIG. 4 illustrates an example of the structure of a filter circuit.

FIG. 4 illustrates an example of the structure of a filter circuit. A filter circuit 18a2 includes a capacitor C1 and a resistor R1 and is a low-pass filter. One end of the resistor R1 is connected to a positive side input terminal of an input voltage Vin and the other end of the resistor R1 is connected to one end of the capacitor C1 and a positive side output terminal of an output voltage Vout.

The other end of the capacitor C1 is connected to a negative side input terminal of the input voltage Vin and a negative side output terminal of the output voltage Vout. The filter circuit 18a2, which is a low-pass filter, removes a high-frequency noise component from the external signal ex.

Figure 5:
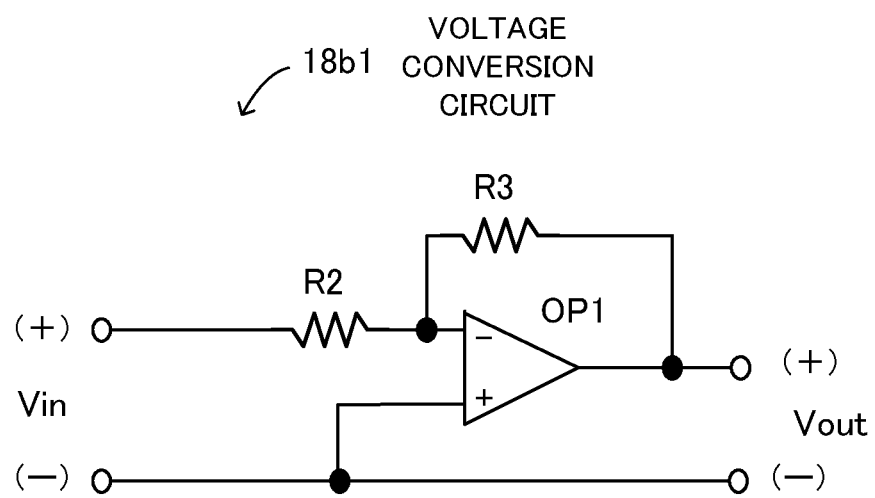
FIG. 5 illustrates an example of the structure of a voltage conversion circuit.

FIG. 5 illustrates an example of the structure of a voltage conversion circuit. A voltage conversion circuit 18b1 includes resistors R2 and R3 and an operational amplifier OP1 and is an inverting amplification circuit. One end of the resistor R2 is connected to a positive side input terminal of an input voltage Vin and the other end of the resistor R2 is connected to one end of the resistor R3 and an inverting input terminal (−) of the operational amplifier OP1.

The other end of the resistor R3 is connected to an output terminal of the operational amplifier OP1 and a positive side output terminal of an output voltage Vout. A non-inverting input terminal (+) of the operational amplifier OP1 is connected to a negative side input terminal of the input voltage Vin and a negative side output terminal of the output voltage Vout.

With the voltage conversion circuit 18b1, the sign of the output voltage Vout of the inverting amplification circuit is obtained by inverting the sign of the input voltage Vin. The amplification factor depends on the ratio of the resistor R2 to the resistor R3. By setting resistance values of the resistors R2 and R3 so that the amplification factor will be 1 or less, the voltage conversion circuit 18b1 is used as an attenuator which attenuates an input voltage.

Figure 6:
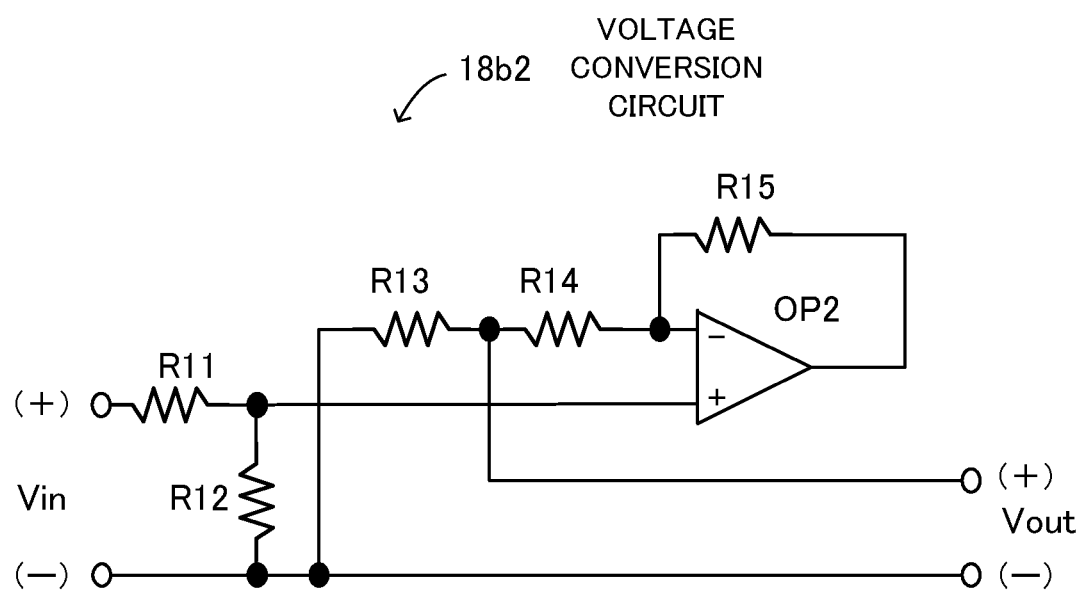
FIG. 6 illustrates an example of the structure of a voltage conversion circuit.

FIG. 6 illustrates an example of the structure of a voltage conversion circuit. A voltage conversion circuit 18b2 includes resistors R11, . . . , and R15 and an operational amplifier OP2 and is an inverting amplification circuit. One end of the resistor R11 is connected to a positive side input terminal of an input voltage Vin and the other end of the resistor R11 is connected to one end of the resistor R12 and a non-inverting input terminal (+) of the operational amplifier OP2.

The other end of the resistor R12 is connected to a negative side input terminal of the input voltage Vin, one end of the resistor R13, and a negative side output terminal of an output voltage Vout. The other end of the resistor R13 is connected to one end of the resistor R14 and a positive side output terminal of the output voltage Vout. The other end of the resistor R14 is connected to an inverting input terminal (−) of the operational amplifier OP2 and one end of the resistor R15. The other end of the resistor R15 is connected to an output terminal of the operational amplifier OP2. It is also possible to make the voltage conversion circuit 18b2 function as an attenuator which attenuates an input voltage.

Figure 7:
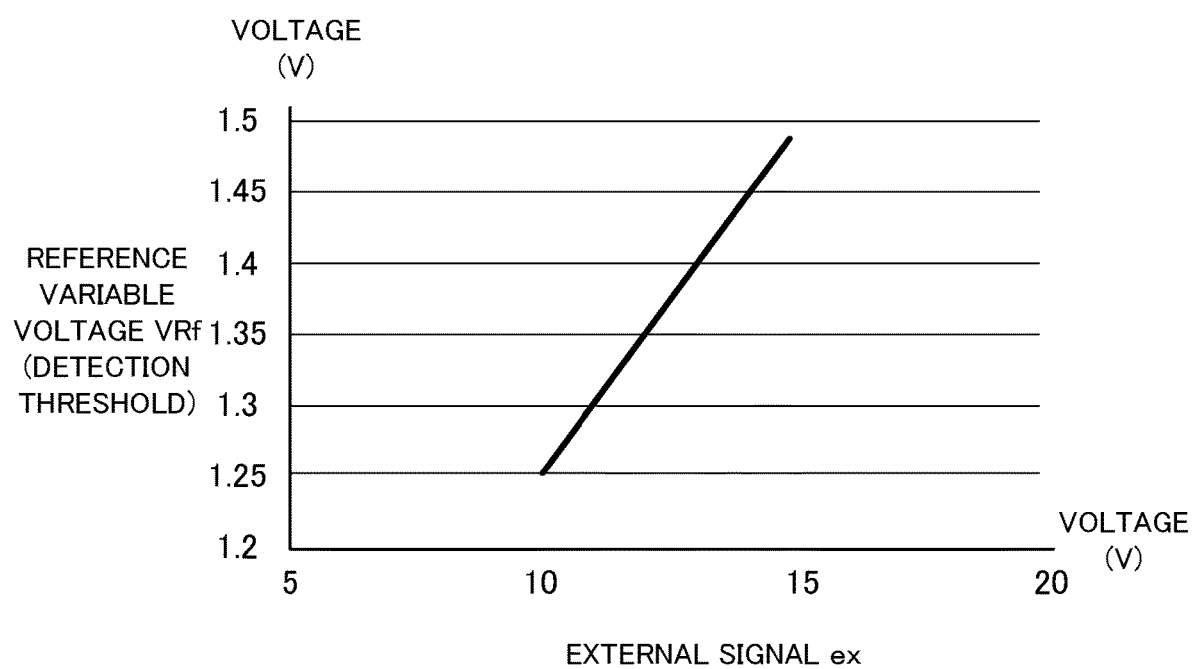
FIG. 7 illustrates an example of the relationship between a detection threshold and an external signal.

FIG. 7 illustrates an example of the relationship between a detection threshold and an external signal. In FIG. 7, a vertical axis indicates a detection threshold. For example, a vertical axis indicates a voltage (V) of the reference variable voltage VRf of the comparator cmp3 included in the temperature detection circuit 13. In FIG. 7, a horizontal axis indicates a voltage (V) of the external signal ex.

If the external signal ex having a voltage of 10 volts is inputted to the external terminal IN2, then the detection threshold adjustment circuit 18 performs voltage conversion and the reference variable voltage VRf of the comparator cmp3 is set to 1.25 V. Furthermore, if the external signal ex having a voltage of 15 volts is inputted to the external terminal IN2, then the detection threshold adjustment circuit 18 performs voltage conversion and the reference variable voltage VRf of the comparator cmp3 is set to 1.5 V.

The detection threshold adjustment circuit 18 narrows in this way a voltage range of 5 volts from 10 to volts for the external signal ex to a voltage range of 0.25 volts from 1.25 to 1.5 volts for the reference variable voltage VRf.

Accordingly, if the external signal ex in the voltage range of 10 to 15 volts is inputted, then it is decreased to a detection threshold level of a determined comparator by voltage conversion performed by the detection threshold adjustment circuit 18. As a result, even if the external signal ex at a high voltage level which is less likely to be affected by disturbance is inputted, a detection threshold is set with accuracy.

Figure 8:
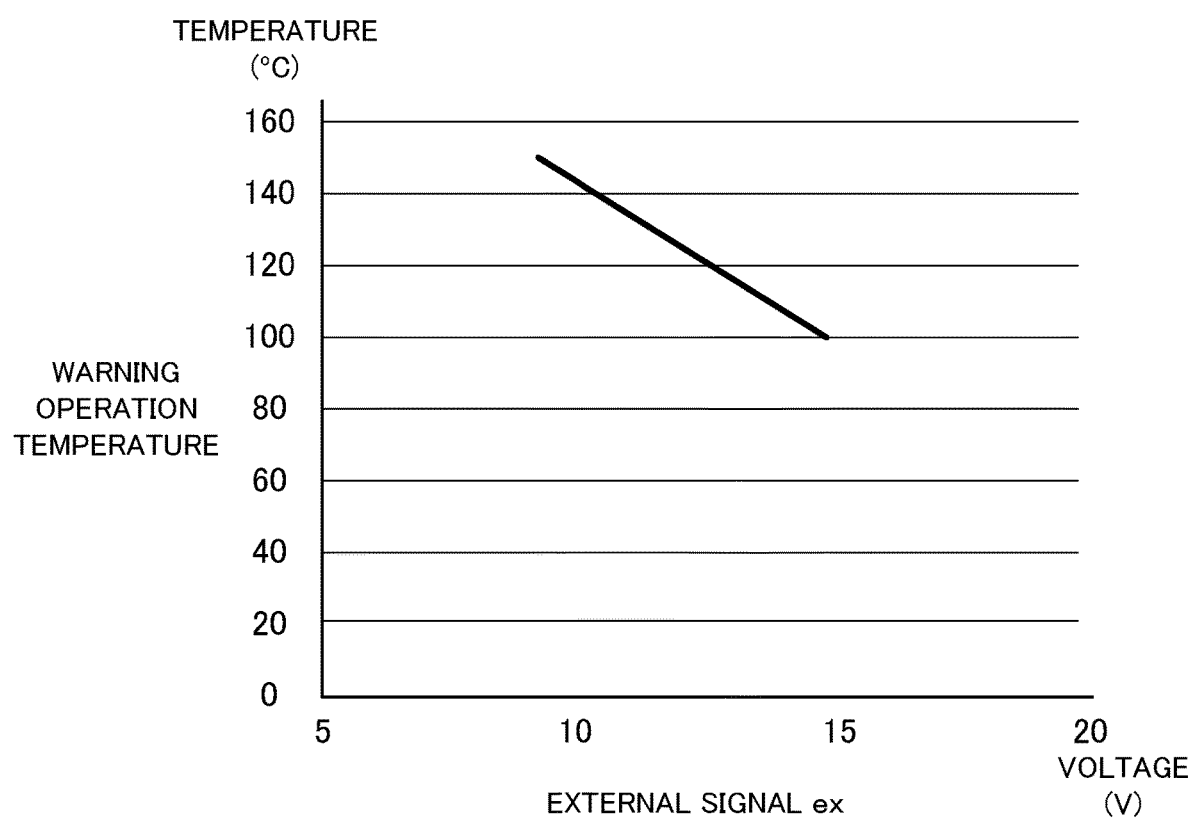
FIG. 8 illustrates an example of the relationship between warning operation temperature and an external signal.

FIG. 8 illustrates an example of the relationship between warning operation temperature and an external signal. In FIG. 8, a vertical axis indicates warning operation temperature (° C.). An H level is outputted from the comparator cmp3 included in the temperature detection circuit 13, the warning generation circuit 16 drives, and the warning notification signal w is outputted from the output terminal OUT4. The warning operation temperature is the temperature of the IGBT 2a at this time. In FIG. 8, a horizontal axis indicates a voltage (V) of the external signal ex.

If the external signal ex having a voltage of 10 volts is inputted to the external terminal IN2, then the warning notification signal w is outputted at a warning operation temperature of 150° C. Furthermore, if the external signal ex having a voltage of 15 volts is inputted to the external terminal IN2, then the warning notification signal w is outputted at a warning operation temperature of 100° C.

The reference variable voltage VRf of the comparator cmp3 included in the temperature detection circuit 13 is changed by changing a voltage of the external signal ex in this way. As a result, as illustrated in FIG. 8, warning operation temperature is changed.

For example, if the user wants to receive warning notification when warning operation temperature is 150° C., then the user inputs the external signal ex having a voltage of 10 volts to the external terminal IN2 and performs setting. If the user wants to receive warning notification when warning operation temperature is 100° C., then the user inputs the external signal ex having a voltage of 15 volts to the external terminal IN2 and performs setting. A detection level at which the warning notification signal w is outputted is changed flexibly and easily in this way according to customers or uses.

Figure 9:
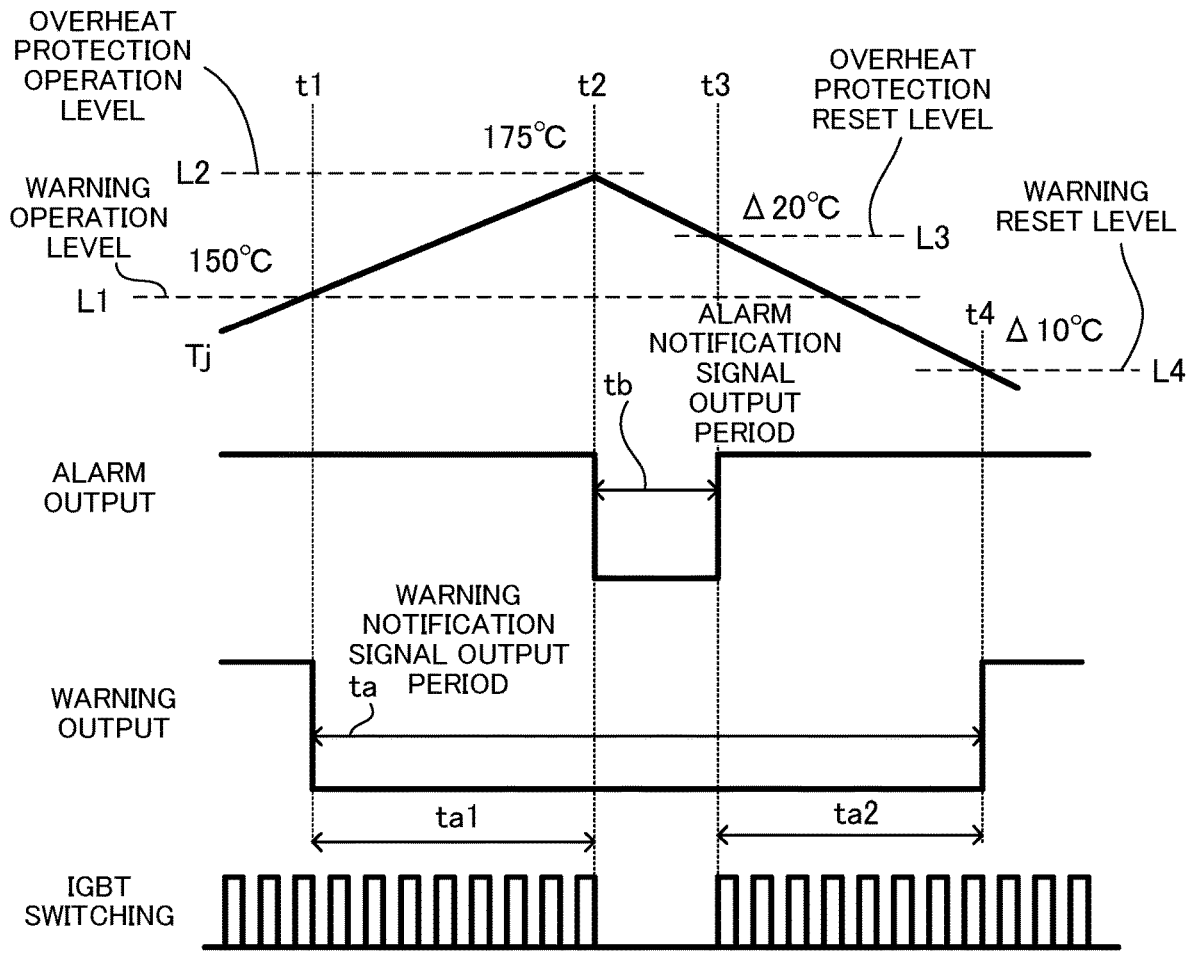
FIG. 9 illustrates an example of the relationship between an alarm output and a warning output in overheat protection.

FIG. 9 illustrates an example of the relationship between an alarm output and a warning output in overheat protection.

(Time t1) When the driving temperature Tj of the IGBT 2a reaches a warning operation level L1 (150° C., for example), the warning notification signal w is outputted. The switching operation of the IGBT 2a is continued during periods ta1 and ta2 during which the warning notification signal w is outputted and the alarm notification signal arm is not outputted.

(Time t2) When the driving temperature Tj of the IGBT 2a reaches an overheat protection operation level L2 (175° C., for example), the alarm notification signal arm is outputted. The switching operation of the IGBT 2a is stopped during a period tb during which the alarm notification signal arm is outputted.

(Time t3) When the driving temperature Tj of the IGBT 2a falls to an overheat protection reset level L3 (155° C., for example), the output of the alarm notification signal arm is stopped. The period tb during which the alarm notification signal arm is outputted lasts in this way until the driving temperature Tj of the IGBT 2a falls to the overheat protection reset level L3.

(Time t4) When the driving temperature Tj of the IGBT 2a falls to a warning reset level L4 (140° C., for example), the output of the warning notification signal w is stopped. A period to during which the warning notification signal w is outputted lasts in this way until the driving temperature Tj of the IGBT 2a falls to the warning reset level L4.

Figure 10:
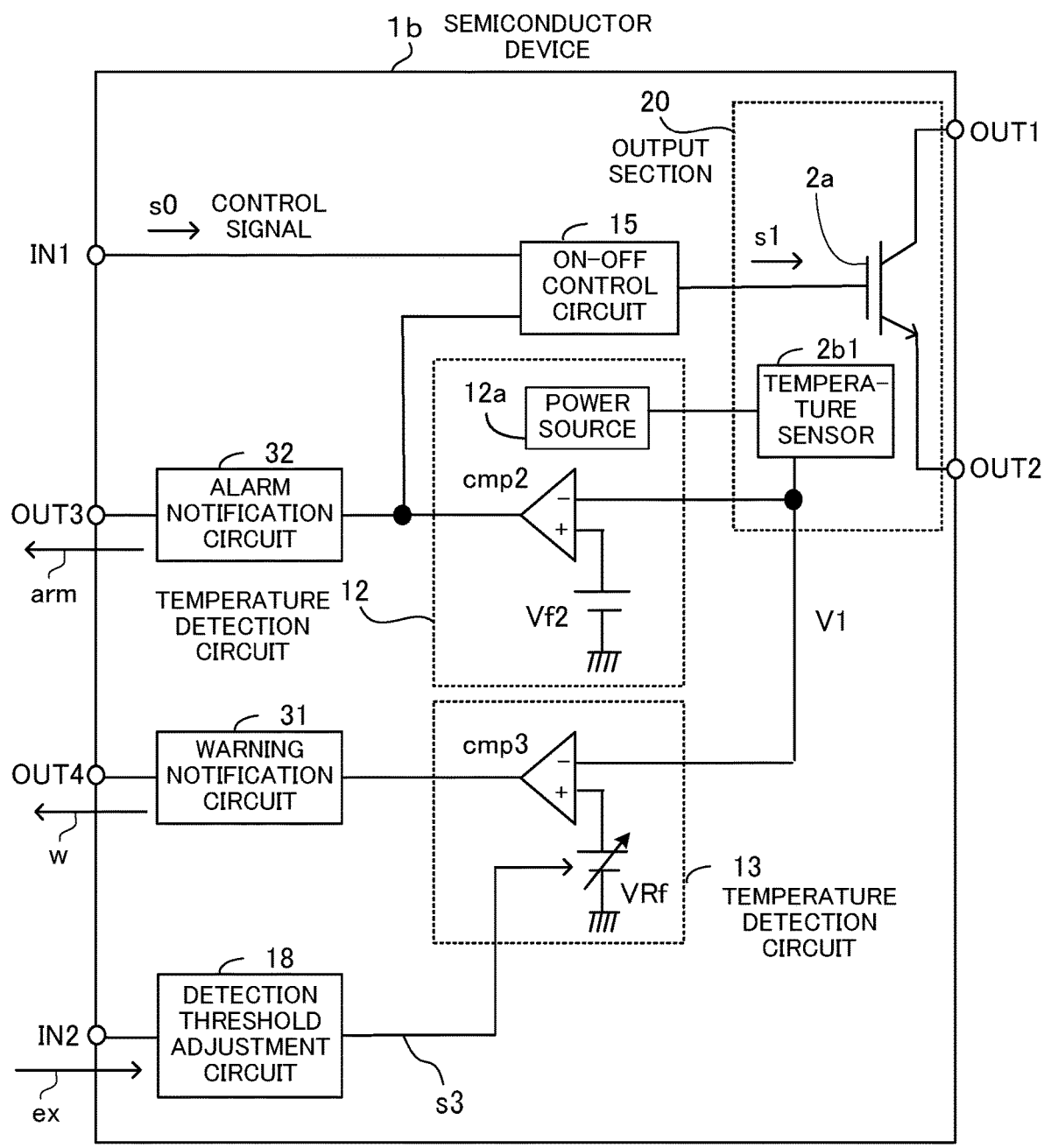
FIG. 10 illustrates an example of the structure of a semiconductor device.
Figure 11:
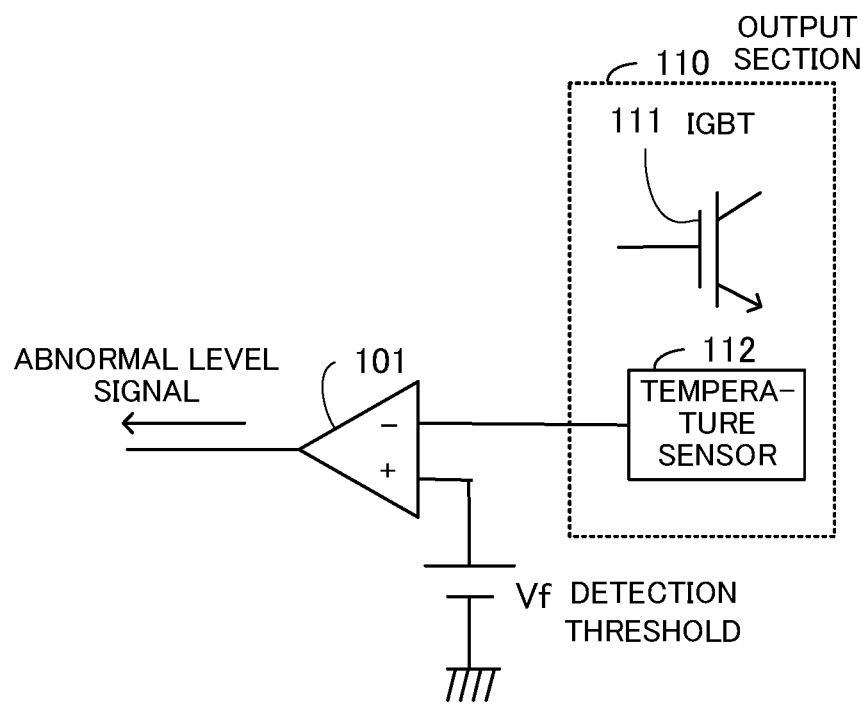
FIG. 11 is a view for describing the protection function of a conventional IPM.

FIG. 10 illustrates an example of the structure of a semiconductor device. A semiconductor device 1b has an overheat protection function as a protection function. The semiconductor device 1b has the same function as the overheat protection by the semiconductor device 1a illustrated in FIG. 2. Accordingly, the same components that are illustrated in FIG. 2 are marked with the same numerals and description and the like of the same operation will be properly simplified.

The semiconductor device 1b includes an input terminal IN1, an external terminal IN2, and output terminals OUT1, ..., and OUT4. Furthermore, the semiconductor device 1b includes an output section 20, temperature detection circuits 12 and 13, an on-off control circuit 15, a warning notification circuit 31 (notice alarm notification circuit), an alarm notification circuit 32, and a detection threshold adjustment circuit 18.

The output section 20 includes an IGBT 2a and a temperature sensor 2b1. In the example of FIG. 10 in which the IGBT 2a is located on the high side, a collector of the IGBT 2a is connected to the output terminal OUT1 and an emitter of the IGBT 2a is connected to the output terminal OUT2.

The temperature detection circuit 12 includes a power source 12a, a comparator cmp2, and a reference power source which outputs a reference voltage Vf2 (second detection threshold). The temperature detection circuit 13 includes a comparator cmp3 and a reference variable power source which outputs a reference variable voltage VRf (first detection threshold).

For example, a microcomputer is connected to the input terminal IN1 and a pulsed control signal s0 outputted from the microcomputer is inputted to one input end of the on-off control circuit 15. The on-off control circuit 15 generates, on the basis of the control signal s0, a drive signal s1 for driving the IGBT 2a and outputs the drive signal s1 to a gate of the IGBT 2a.

The power source 12a supplies a power source voltage to the temperature sensor 2b1. The temperature sensor 2b1 measures driving temperature of the IGBT 2a and outputs a voltage signal V1 corresponding to a measurement result.

The reference variable voltage VRf is inputted to a non-inverting input terminal (+) of the comparator cmp3 included in the temperature detection circuit 13 and the voltage signal V1 is inputted to an inverting input terminal (−) of the comparator cmp3.

If an H level is outputted from the comparator cmp3, then driving temperature of the IGBT 2a is at a warning level, that is to say, in an overheat state. When the warning notification circuit 31 receives the H-level signal outputted from the comparator cmp3, the warning notification circuit 31 generates a warning notification signal w, outputs it from the output terminal OUT4, and informs the outside that driving temperature of the IGBT 2a is at a warning level, that is to say, in an overheat state.

The reference voltage Vf2 is inputted to a non-inverting input terminal (+) of the comparator cmp2 included in the temperature detection circuit 12 and the voltage signal V1 is inputted to an inverting input terminal (−) of the comparator cmp2.

If an H level is outputted from the comparator cmp2, then driving temperature of the IGBT 2a is at an alarm level, that is to say, in an overheat state. When the alarm notification circuit 32 receives the H-level signal outputted from the comparator cmp2, the alarm notification circuit 32 outputs an alarm notification signal arm from the output terminal OUT3 and informs the outside that driving temperature of the IGBT 2a is at an alarm level, that is to say, in an overheat state. The reference voltage Vf2 is set to a level lower than that of the reference variable voltage VRf.

On the other hand, an output end of the comparator cmp2 is also connected to the other input end of the on-off control circuit 15. When the on-off control circuit 15 receives the H-level signal outputted from the comparator cmp2, the on-off control circuit 15 outputs an L-level drive signal s1 to the gate of the IGBT 2a to turn off the IGBT 2a.

An external signal ex is inputted to the external terminal IN2. The external signal ex is used for adjusting the reference variable voltage VRf used in the temperature detection circuit 13. A detection threshold adjustment circuit 18 generates an adjustment signal s3 on the basis of the external signal ex inputted, and adjusts the reference variable voltage VRf, which is a detection threshold, and sets the reference variable voltage VRf to a determined value by the adjustment signal s3. The same structures that are illustrated in FIGS. 3 through 6 may be applied to the internal structure of the detection threshold adjustment circuit 18.

In the example of FIG. 10, the detection threshold adjustment circuit 18 adjusts the reference variable voltage VRf in the temperature detection circuit 13. However, the detection threshold adjustment circuit 18 may adjust the reference voltage Vf2 in the temperature detection circuit 12. Furthermore, the detection threshold adjustment circuit 18 may adjust both of the reference variable voltage VRf and the reference voltage Vf2. In such a case, however, the external signal ex for adjusting the reference variable voltage VRf and an external signal for adjusting the reference voltage Vf2 are needed. Therefore, it is desirable to locate two external terminals and two detection threshold adjustment circuits 18. That is to say, one of the two detection threshold adjustment circuits 18 is used for adjusting the reference variable voltage VRf and the other is used for adjusting the reference voltage Vf2.

According to the present disclosure, as has been described, a detection threshold adjustment circuit adjusts, on the basis of an external signal inputted via an external terminal, a detection threshold used for detecting an abnormal level of an operating state of an output element.

Traditionally, a detection threshold has been fixed in the manufacturing stage. According to the present disclosure, however, a detection threshold used in a protection function is flexibly changed to a desired value according to customers or uses. Furthermore, a detection threshold is adjusted by an external signal and a detection level at which an abnormal level signal is outputted is changed. By doing so, products suitable for uses are manufactured.

The embodiments have been taken as examples. The structure of each section indicated in each embodiment may be replaced by another structure having the same function. Furthermore, any other component or process may be added. Moreover, the structures (features) of any two or more of the above embodiments may be combined.

According to an aspect, a detection threshold in a protection function is changed flexibly and easily.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device having a load, comprising:
   an output element configured to be connected to the load, the output element being switchable to operate the load;
   a drive circuit which outputs a drive signal for driving the output element to switch;
   a detection circuit which compares a state signal, indicative of an operating state of the output element, with a detection threshold, to thereby detect an abnormal level of the operating state;
   an abnormal level notification circuit which informs an outside of the detected abnormal level;
   an external terminal configured to receive an external signal for adjusting the detection threshold; and
   a detection threshold adjustment circuit which adjusts the detection threshold on a basis of the received external signal.

2. The semiconductor device according to claim 1, wherein the state signal indicates at least one of a temperature of the output element, a current flowing through the output element, or a control voltage in the device.

3. The semiconductor device according to claim 2, wherein:
   the detection circuit includes
      a control voltage detection circuit which detects a voltage level of the control voltage,
      first and second temperature detection circuits which detect a temperature state of the output element, and an overcurrent detection circuit which detects a current state of the output element;

the control voltage detection circuit detects a control voltage decrease abnormal level at a time of a decrease of the control voltage, on a basis of a comparison result between the control voltage and a first detection threshold;

the first temperature detection circuit detects a first overheat state abnormal level at a time of the output element reaching a first overheat state, on a basis of a comparison result between a first voltage signal indicative of the temperature state of the output element and a second detection threshold;

the second temperature detection circuit detects a second overheat state abnormal level at a time of the output element reaching a second overheat state, in which a temperature is higher than a temperature of the first overheat state, on a basis of a comparison result between the first voltage signal and a third detection threshold; and the overcurrent detection circuit detects an overcurrent abnormal level at a time of the output element reaching an overcurrent state, on a basis of a comparison result between a second voltage signal indicative of the current state of the output element and a fourth detection threshold.

4. The semiconductor device according to claim 3, wherein the detection threshold adjustment circuit adjusts at least one of the first detection threshold, the second detection threshold, the third detection threshold, or the fourth detection threshold, based on the external signal.

5. The semiconductor device according to claim 3, wherein:

the abnormal level notification circuit outputs a first alarm signal having a first pulse width when the overcurrent abnormal level is detected;

the abnormal level notification circuit outputs a second alarm signal having a second pulse width when the control voltage decrease abnormal level is detected;

the abnormal level notification circuit outputs a third alarm signal having a third pulse width when the second overheat state abnormal level is detected;

the abnormal level notification circuit outputs a notice alarm signal when the first overheat state abnormal level is detected; and the first pulse width, the second pulse width, and the third pulse width differ from one another.

6. The semiconductor device according to claim 5, wherein:

the third pulse width is greater than the second pulse width; and the second pulse width is greater than the first pulse width.

7. The semiconductor device according to claim 5, wherein when one of the first alarm signal, the second alarm signal, or the third alarm signal is outputted, the drive circuit turns off the output element to stop driving the output element.

8. The semiconductor device according to claim 1, wherein the detection threshold adjustment circuit includes:

a filter circuit which smoothes the external signal; and a voltage conversion circuit which decreases a voltage level of an output signal of the filter circuit to a pre-determined voltage level.

9. The semiconductor device according to claim 8, wherein:

the filter circuit is a high-pass filter or a low-pass filter; and the voltage conversion circuit is an attenuator of an inverting amplification circuit.

10. A semiconductor device having a load, comprising:

an output element configured to be connected to the load, the output element being switchable to operate the load;

a first temperature detection circuit which detects a first overheat state abnormal level at a time of the output element reaching a first overheat state, on a basis of a comparison result between a voltage signal, indicative of a temperature state of the output element, and a first detection threshold;

a second temperature detection circuit which detects a second overheat state abnormal level at a time of the output element reaching a second overheat state, in which a temperature is higher than a temperature of the first overheat state, on a basis of a comparison result between the voltage signal and a second detection threshold;

a notice alarm notification circuit which outputs a notice alarm signal when the first overheat state abnormal level is detected;

an alarm notification circuit which outputs an alarm signal when the second overheat state abnormal level is detected;

a drive circuit which outputs a drive signal for driving the output element, and which stops driving the output element when the alarm signal is outputted;

an external terminal configured to receive an external signal; and a detection threshold adjustment circuit which adjusts the first detection threshold, the second detection threshold, or both, on a basis of the received external signal.

* * * * *